United States Patent
Wyler

(10) Patent No.: US 6,269,863 B1
(45) Date of Patent: Aug. 7, 2001

(54) INTEGRATED PROCESSOR MOUNTING MECHANISM AND HEAT SINK

(75) Inventor: Gregory T. Wyler, Ipswich, MA (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/334,218

(22) Filed: Jun. 16, 1999

Related U.S. Application Data
(60) Provisional application No. 60/103,663, filed on Oct. 9, 1998.

(51) Int. Cl.[7] ........................................................ F28F 7/00
(52) U.S. Cl. ...................... 165/80.3; 165/185; 174/16.3; 257/722; 361/697; 361/704
(58) Field of Search .................................. 165/80.3, 185; 361/704, 697, 703, 709, 717, 719; 174/16.3; 257/706, 687, 717, 722

(56) References Cited

U.S. PATENT DOCUMENTS

| | | | |
|---|---|---|---|
| 3,790,859 | 2/1974 | Schraeder et al. | 317/100 |
| 5,047,837 | * 9/1991 | Kitano et al. | 357/81 |
| 5,542,176 | * 8/1996 | Serizawa et al. | 29/890.03 |
| 5,701,951 | * 12/1997 | Jean | 165/121 |
| 5,706,169 | * 1/1998 | Yeh | 165/80.3 |
| 5,748,446 | 5/1998 | Feightner et al. | 361/709 |
| 5,810,072 | 9/1998 | Rees et al. | 165/80.3 |
| 5,815,371 | 9/1998 | Jeffries et al. | 361/704 |
| 5,835,347 | * 11/1998 | Chu | 165/80.3 |
| 5,841,633 | * 2/1999 | Huang | 165/80.3 |
| 5,854,738 | * 12/1998 | Bowler | 361/695 |
| 5,870,288 | * 2/1999 | Chen | 361/704 |
| 5,893,409 | * 4/1999 | Kohler et al. | 165/80.3 |
| 5,947,192 | * 9/1999 | Kuo | 165/80.3 |
| 5,973,921 | * 10/1999 | Lin | 174/16.3 |
| 5,982,622 | * 11/1999 | Chiou | 361/719 |
| 6,003,586 | * 12/1999 | Beane | 164/63 |
| 6,046,906 | * 4/2000 | Tseng | 361/704 |
| 6,093,961 | * 7/2000 | McCullough | 257/718 |

FOREIGN PATENT DOCUMENTS

| | | | |
|---|---|---|---|
| 297 19 231 U1 | 4/1997 | (DE) | G06F/1/20 |
| 51-114879 | 2/1976 | (JP) | H01L/23/42 |
| 3-96089 | 10/1991 | (JP) | H05K/7/20 |
| 5-41196 | 6/1993 | (JP) | H05K/7/20 |
| 5-343872 | 12/1993 | (JP) | H05K/7/20 |
| 8-172284 | 7/1996 | (JP) | H05K/7/20 |

OTHER PUBLICATIONS

Heatsink Attachment for Improved Electro–Magnetic Compatibility and Shock Performance, IBM Technical Disclosure Bulletin, Mar. 1995.
European Patent Office Search Report.

* cited by examiner

*Primary Examiner*—Marvin M. Lateef
*Assistant Examiner*—Terrell McKinnon
(74) *Attorney, Agent, or Firm*—Robert J. Zeitler

(57) ABSTRACT

An integrated heat sink/retention mechanism and a method for mounting a processor assembly on a circuit board using such an integrated heat sink/retention mechanism. The method involves attaching an integrated heat sink/retention mechanism onto the circuit board. A grounding connection may be formed between the circuit board and the integrated heat sink/retention mechanism. The integrated heat sink/retention mechanism is designed so that the heat sink is attachable to a processor assembly and mountable on a circuit board.

31 Claims, 7 Drawing Sheets

INTEGRATED PROCESSOR MOUNTING MECHANISM AND HEAT SINK

This application claims priority from U.S. Provisional Patent Application No. 60/103,663, filed Oct. 9, 1998 and entitled "Integrated Processor Mounting Mechanism and Heat Sink" which is incorporated herein by reference.

BACKGROUND OF THE INVENTION

The present invention is related to mounting mechanisms for computer processors. Computer processors typically are housed within an assembly that includes a thermal plate which is in thermal contact with the computer processor. As computer processors are designed to become faster and faster, they likewise tend to generate increased amounts of heat. In order to assist in dissipating heat, a heat sink is mounted in thermal contact with the thermal plate of the computer processor assembly. Another concern that will be encountered as computer processors become faster is the effects of electromagnetic interference (EMI). EMI will shortly become a major hurdle for manufacturers as processor speeds reach 500 MHz.

A conventional motherboard design for a Pentium II processor assembly includes a printed circuit board with a slot connector fixed thereon. The slot connector includes an elongated slot for engagement with a connector on the computer processor board. The computer processor board is housed in an assembly typically referred to as a cartridge. Some Pentium II processor assemblies are designed for mounting on a printed circuit board with the computer processor board oriented perpendicular to the printed circuit board. A retention mechanism is fastened to the printed circuit board straddling the slot connector and providing vertical struts into which the Pentium II processor cartridge slides for securing the processor to the motherboard. A heat sink is typically mounted onto the thermal plate. A support base may be provided on the motherboard to help support the weight of the heat sink extending out from the thermal plate.

SUMMARY OF THE INVENTION

The present invention relates to an integrated heat sink and retention mechanism. An embodiment of the invention is a method for mounting, a processor assembly on a circuit board using an integrated heat sink/retention mechanism. The integrated heat sink/retention mechanism is attached to the processor assembly so as to establish thermal contact between the flat surface of the heat sink and the flat surface of the processor assembly. The integrated heat sink/retention mechanism is mounted on the circuit board so as to hold the flat surface of the processor assembly fixed perpendicularly relative to the circuit board. It may thus be unnecessary for a motherboard manufacturer to locate, purchase and mount a separate retention mechanism and heat sink for each processor assembly to be mounted on a board.

In accordance with a further embodiment of the method of the present invention, a heat sink is attached to the processor assembly. The heat sink is mounted on the circuit board by making a grounding connection between the heat sink and the circuit board. This method creates an electromagnetic interference shield using the same steps required to assemble a heat sink and processor assembly on a circuit board. The heat sink for use in these methods may be any of a number of types that provide ample surface area for dissipation of heat. For example, the heat sink may be a corrugated thermally conductive sheet clamped to a thermally conductive base plate. Alternatively, the heat sink may be a device with a flat surface on one side and a plurality of heat conductive surfaces projecting out of the opposite side forming a plurality of air passageways. The heat sink may be provided with at least one mounting extension for fastening to the circuit board.

An embodiment of the integrated heat sink/retention mechanism of the present invention includes a heat sink and a mechanism for attaching the heat sink to a processor assembly. A mount connected to the heat sink is used to securely mount the heat sink on a circuit board so as to orient the processor assembly perpendicular to the circuit board. The mount connected to the heat sink may be a mounting extension that is integral with the heat sink. The mounting extension and heat sink may provide an electrically conductive path from the heat generating processor assembly to the mounting extension. The mounting extension may be a plurality of legs with feet that are insertable into retention slots attached to a circuit board. Alternatively, the mounting extensions may be fastenable directly to the circuit board.

A motherboard of an embodiment of the invention includes a slot connector having an elongated slot and a plurality of retention slots. The retention slots may be in contact with a grounding plane such that the heat sink provides an electrically grounded path to the thermal plate of the processor assembly. With the heat sink serving as the retention mechanism for the processor assembly, fewer parts need to be purchased and assembled in the formation of a motherboard.

DETAILED DESCRIPTION OF THE PREFERRED EMBODIMENTS

Figure 1:
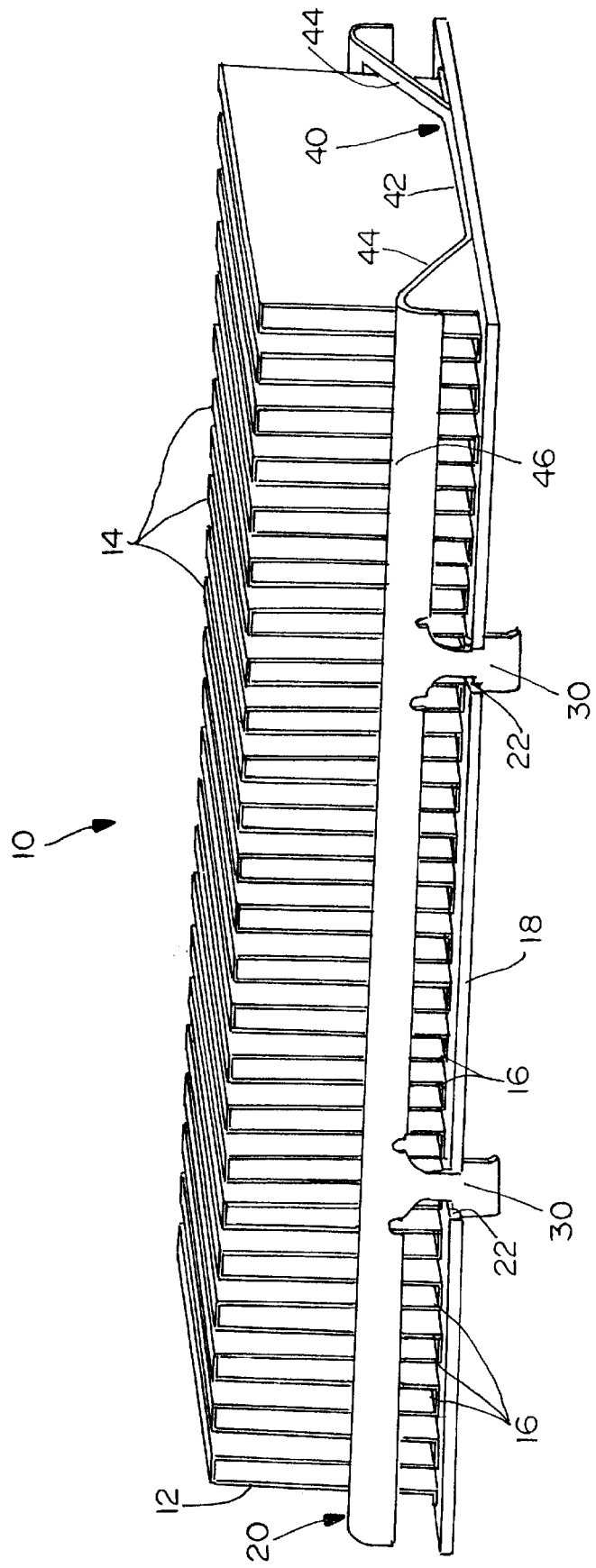
FIG. 1 is an isometric view of a heat sink.

Referring now to FIG. 1, an example of a heat sink 10 that may be used in an embodiment of the present invention is shown. The heat sink 10 is made using a corrugated metal sheet, commonly known as a convoluted fin or folded fin 12. The folded fin 12 is a thermally conductive sheet that has been folded into a series of alternating ridges 14 and troughs 16. The folded fin 12 provides a significant amount of surface area from which air can dissipate heat. The fins separate a series of air passageways through the heat sink by which air passes over the surface area of the fins. A presently preferred folded fin is made from an aluminum sheet 0.254 mm. thick. The height of the fins forming the ridges 14 and troughs 16 would depend on the desired application. The taller the fins, the more surface area and thus the greater amount of heat dissipation achieved for a given amount of air flow. Holes of various sizes may be cut in the ridges of the folded fin to provide additional pathways for air movement through the heat sink. A preferred method for achieving holes in the ridges of the folded fin is to precut holes in the aluminum sheet before it is folded and then to fold it using an indexing machine to align the holes in the sheet with the ridges of the folded fin.

The folded fin 12 is placed on a thermally conductive base plate 18. In order to improve thermal conductivity, a thermally conductive grease is spread over the base plate 18 for improved thermal contact with the trough 16 of the folded fin 10. The base plate 18 is a flat, stiff piece of aluminum sheet in accordance with the presently preferred heat sink embodiment. The length of the base plate closely approximates the length of the folded fin to be placed thereon. The width of the base plate extends beyond the folded fin on both sides to accommodate a spring clamp 20 which is used to attach the folded fin 12 to the base plate 18. A pair of notches 22 are formed along one edge of the base plate 18. Along the opposite edge, a pair of substantially longer notches 24 are formed along the edge of the base plate. The spring clamp 20 has feet or tabs 30 for engaging with the notches beneath the edge of the base plate. The spring clamp 20 includes a series of flexible linkages 40 for pressing a trough 16 against the base plate 18. Each flexible linkage included in a presently preferred embodiment of the heat sink includes an abutment portion for making contact with the trough 16 of the folded fin 12. In the presently described heat sink embodiment, the abutment portion is a flat midportion 42. The present embodiment includes a flexible linkage for each of the troughs in the folded fin. Less demanding heat sink applications may make do with fewer flexible linkages. At opposite ends of each flat midportion 42, each flexible linkage includes an angled leg portion 44. The angled leg portions extend up from the flat midportion to attach to a crossbar 46. There are two parallel crossbars, each on an opposite side of the spring clamp 20. Each crossbar 46 is connected to all of the flexible linkages. When the spring clamp 20 is connected by its tabs 20 to the base plate 18, the spring clamp applies pressure through the flat midportions 42 to the troughs 16 of the folded fin to provide excellent thermal contact with the underlying base plate 18.

Figure 2:
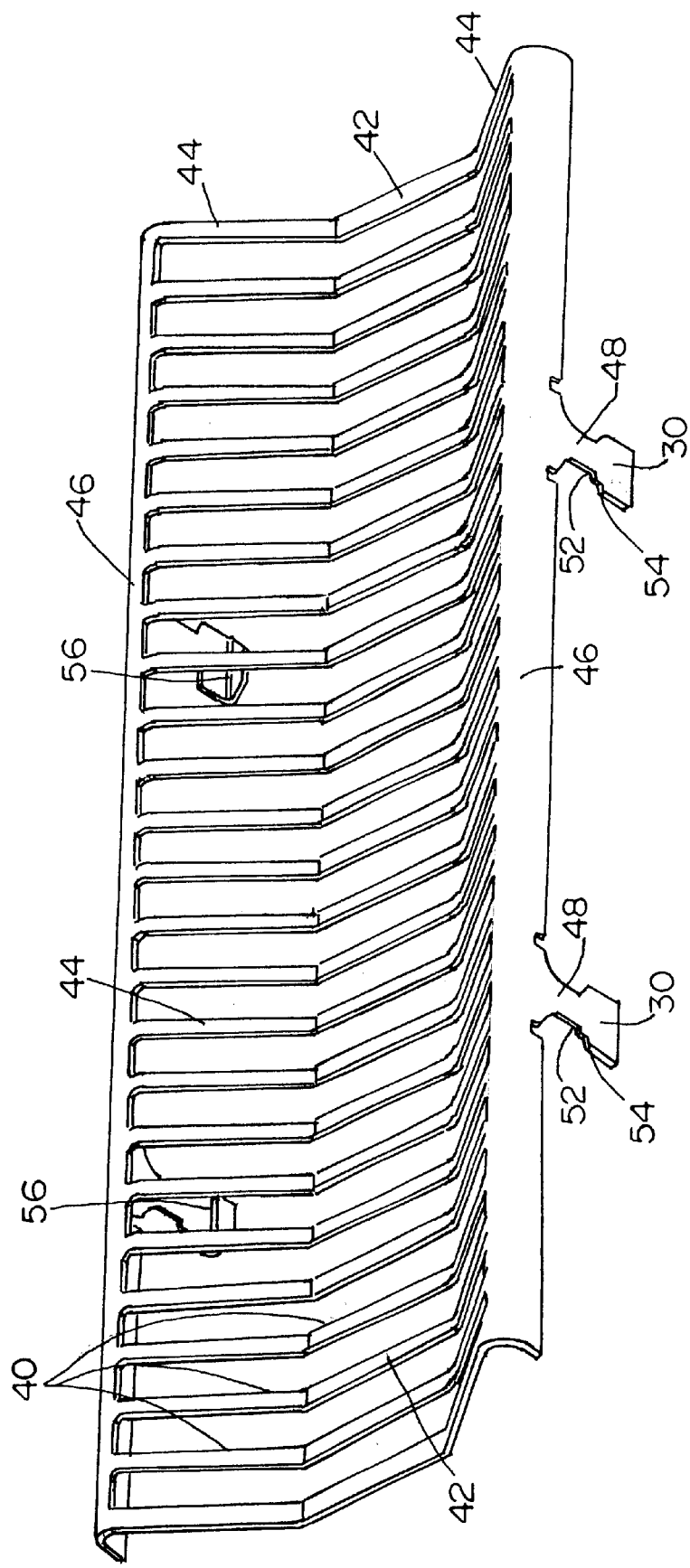
FIG. 2 is an isometric view of a spring clamp for use in the heat sink of FIG. 1.
Figure 3:
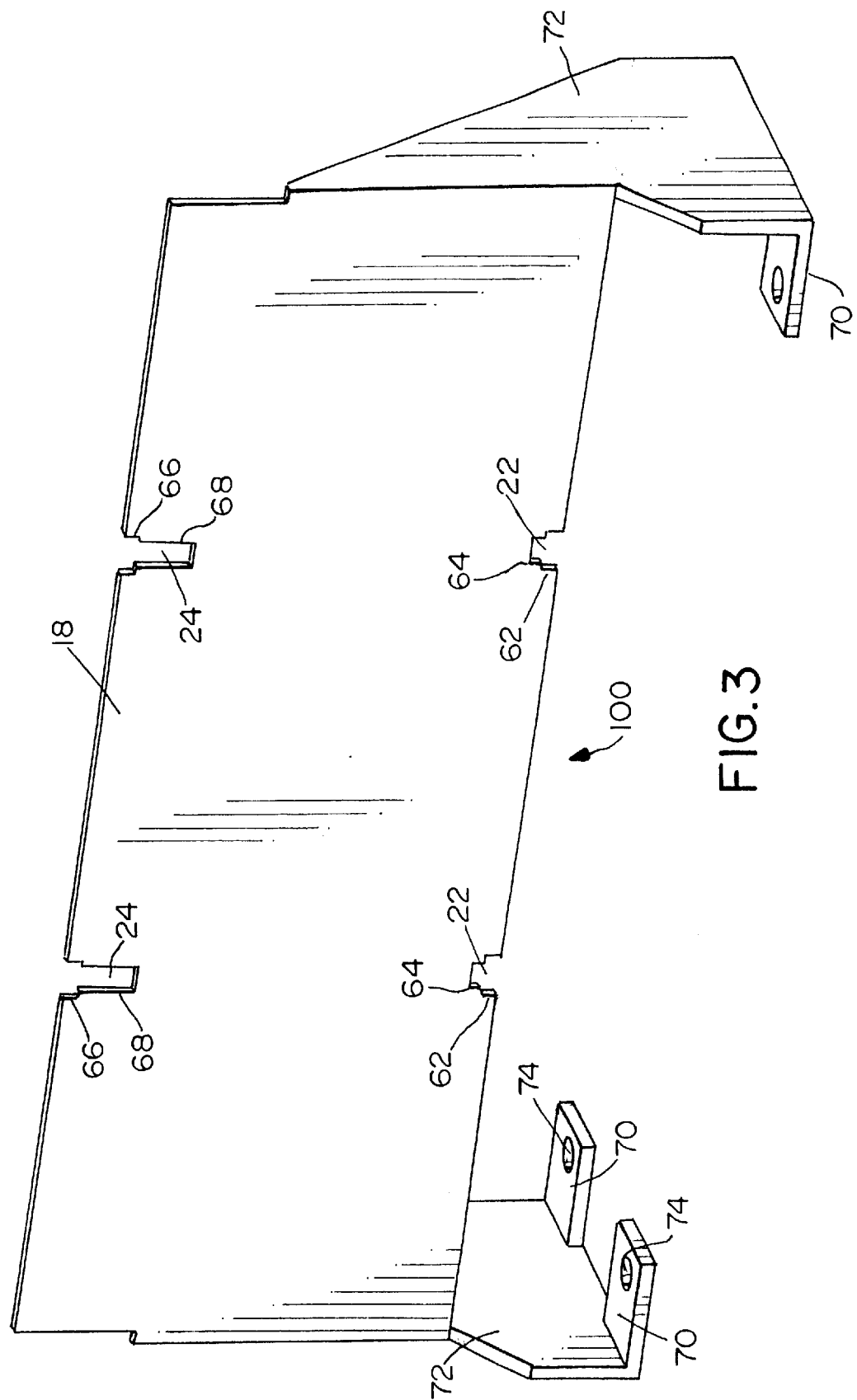
FIG. 3 is an isometric view of a base plate for use in a heat sink/retention mechanism in accordance with an embodiment of the invention.

Referring now to FIG. 2, the spring clamp 20 is shown in greater detail. The tabs 30 depend from the spring clamp 20. In particular, the tabs 30 depend down from the crossbar 46. There are four tabs in the presently described embodiment of the spring clamp 20. A "tab" is defined as any clamping mechanism formed by a projection or member that may be used to engage beneath an edge of a plate. The heat sink may also be formed by substituting a clamping mechanism capable of engaging the base plate in ways other than latching beneath an edge such as latching onto other clamp receiving members and corresponding openings added to a base plate. A stem 48 connects the tab 30 to the crossbar 46. The stem 48 is narrow so that it may move within a correspondingly narrow slot or notch in the base plate or substrate to be cooled. The tab 30 of the embodiment in FIG. 3 is stepped. A first step 52 juts out from the stem 48. The first step 52 extends out from opposite sides of the stem 48. The steps 52 are wider than the narrow slots. Thus, the first steps 52 butt against an edge of the base plate adjacent a narrow slot. A second step 54 extending beneath each of the first steps permits engagement beneath an edge the base plate in an area of a wider slot or notch region. A wider slot or notch region is dimensioned so as to permit the first steps 52 to fit therein but to be too narrow to permit the second steps 54 to fit therein. The tabs 30 are further provided with a bent portion at the end of the tab furthest from the crossbar 46. The bent portion 56 bends inward such that the four bent portions 56 may be used to clamp onto a thermal plate adjacent a processor to be cooled. While bent portions are shown in the present embodiment, any projections capable of grabbing onto a substrate may be substituted for the bent portions. The spring clamp 20 of the present embodiment is entirely formed from a single piece of resilient metal sheet.

The heat sink of FIG. 1 can be transformed into an integrated heat sink and retention mechanism by providing a combination base plate/retention mechanism 100 as shown in FIG. 3. The base plate/retention mechanism includes a base plate portion 18 and mounting extensions 71. The base plate portion 18 has clamp receiving openings that are located for accepting a clamp mechanism such as the tabs from the spring clamp 20. The clamp receiving openings are the notch regions discussed above. Each of the notches includes a wide slot and a narrow slot. The wide slots fit a stem 48 or a first step 52, but not a second step 54. The narrow slots are only wide enough for the stems 48 to fit therein. Along one edge of the base plate 18, the short notches 22 each include a wide slot portion 62 which leads to a narrow slot portion 64. Along the opposite edge of the base plate, the long slots 24 each include a wide slot region 66 and a narrow slot 68. The narrow slot 68 is substantially longer than the narrow slot 64 found on the opposite side of the base plate. In assembling the heat sink assembly, the long narrow slot 68 accommodates the stems 48 on one side of the spring 20 to be inserted therein and slid along those long slots 68. Thus, the tabs 30 on the opposite side of the spring 20 can be lowered beneath the base plate beyond the edge of the base plate. The tabs 30 are brought into position against the slots 22 and the crossbars 46 are pushed on to force the tabs 30 toward the base plate until the wide second steps 54 engage the edge of the base plate beneath the wide slot 62. On the opposite side for the base plate portion 18, the tabs 30 to be pushed outwards moving their stems 48 through the narrow slot 68 until the first steps 52 fall into the wide slot 66 and the second steps 54 engage beneath the base portion 18. Thus, all four tabs will be in engagement beneath the base plate holding the folded fin against the base plate. All the tabs will have their second step 54 engaged beneath an edge of the base plate and their first step 52 will butt against the base plate edge adjacent the narrow slot. Opposing tabs are, thus, forced apart from the relaxed position of the spring clamp 20. This provides a heat sink/retention mechanism that is ready for attachment to a processor assembly in mounting on a circuit board.

The mounting extensions 71 of the base plate/retention mechanism include a pair of legs 72. The legs 72 may be provided with a wide surface area so as to increase the overall surface area of the heat sink 10. The manufacture of the base plate/retention mechanism of FIG. 3 is made advantageously simple in that the mounting extensions 71 and the base plate portion are formed from a single sheet of aluminum sheet metal. Thus, the mounting extensions 71 and base plate 18 are integral with one another. At the bottom of the legs 72 are feet for mounting the heat sink on a circuit board. The feet in the embodiment of FIG. 3 are mounting bases 70. The mounting bases 70 are designed to rest directly on a circuit board to which the heat sink/retention mechanism is to be mounted. The mounting base 70 is perpendicular to the base plate portion 18 so that when mounted on a circuit board, the base plate is supported perpendicular to the circuit board. Each mounting base includes a hole 74 or other like opening for receiving a fastener that will securely hold the mounting base 70 to the circuit board. Any appropriate fastener may be used to mount the mounting base 70 on a circuit board including screws, plugs, or other conventional fastening devices or methods. Alternative methods of mounting may not require the mounting holes 74. For example, the mounting bases can be soldered or clipped onto the circuit board.

Figure 4:
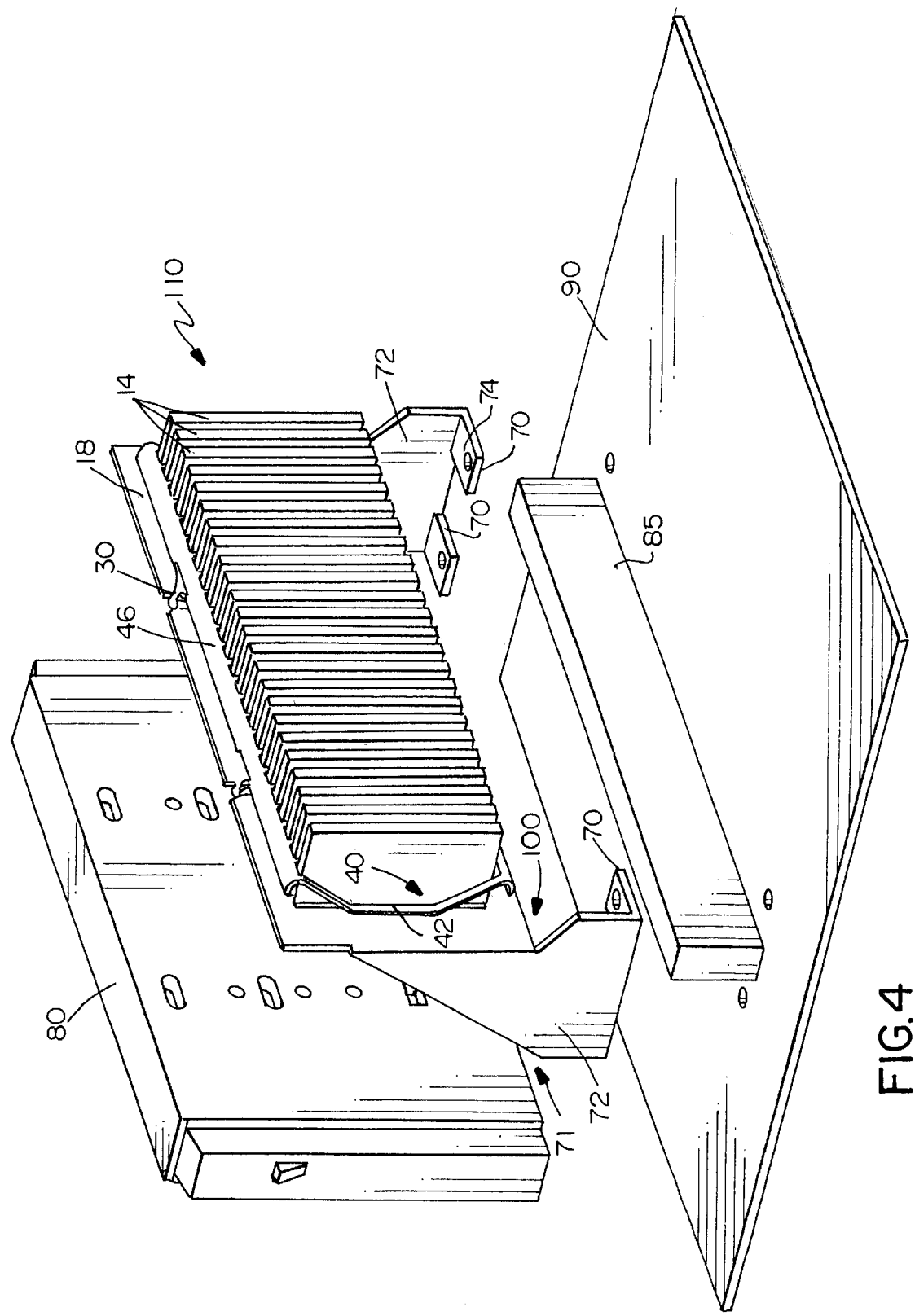
FIG. 4 is a disassembled view of a motherboard and a heat sink/retention mechanism of an embodiment of the invention.
Figure 5:
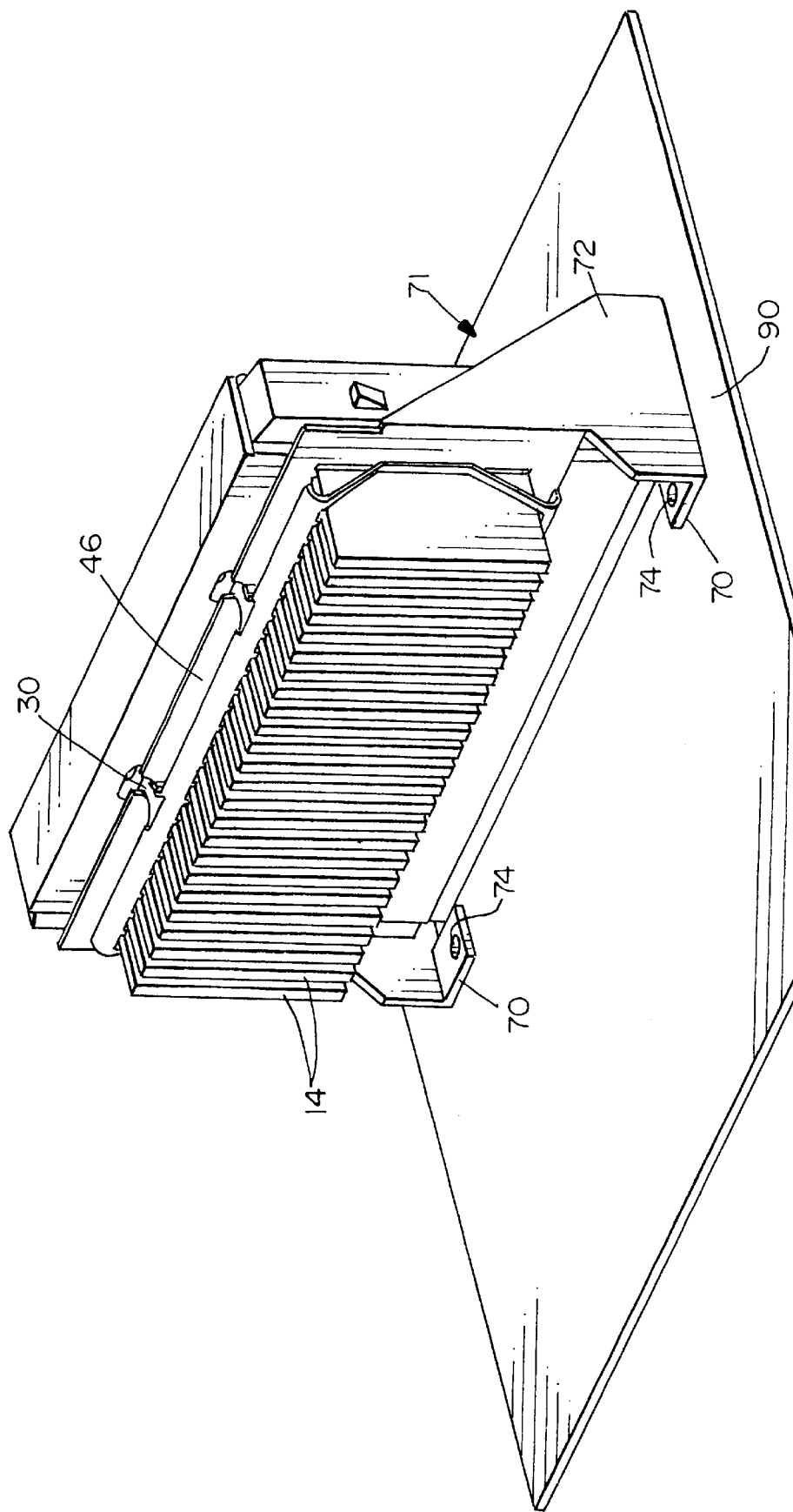
FIG. 5 is an isometric view of a motherboard with the heat sink/retention mechanism of FIG. 4 mounted thereon.

The heat sink/retention mechanism formed by the base plate/retention mechanism of FIG. 3 is shown in conjunction with a processor assembly in FIGS. 4 and 5. The integrated heat sink/retention mechanism of the illustrated embodiment is particularly suited for use with SECC (single edge card connect) and SEPP processor styles. These currently include the Pentium II Slot 1, the Pentium II Slot 2 and the Celeron CPU, all manufactured by Intel. These processor assemblies are housed in cartridges having thermal plate as one of its surfaces. The thermal plate is in contact with the processor chip for dissipating heat therefrom.

The thermal plate on the Pentium II has a number of oval slots. With the four tabs 30 engaged in their wide slots, they are positioned so that the heat sink may be placed on the Pentium II thermal plate with the tabs dropping into the slots of the thermal plate. With the heat sink in place on the thermal plate, it is a simple matter to push down on both crossbars 46 to attach the heat sink to the thermal plate. In the preinstallation condition, all of the tabs 30 are in their wide slots. In the short slots 22, the tabs are held in wide slot 62. In the long slots 24, the tabs held in the wide slot 66. Thus, for all of the tabs 30, the step between the wide slot and the narrow slot in the base plate portion prevents the tabs from compressing closer to each other. Thus, during the simple process of pressing the two crossbars 46 down towards the base plate, the tabs 30 are pushed below the base plate into the thermal plate slots. When the first steps 52 are pushed below the base plate 18, the stems 48 are free to move within the narrow slots toward one another. The tabs are held apart by the bent portions 56 against the edge walls of slots in the thermal plate. The tabs are held apart by the bent portions 56 against the edge walls of the slots in the thermal plate. The tabs are pushed down until the bent portions 56 fit beneath the slot edges in the thermal plate. The resilience of the spring then urges the tabs to spring back toward their opposing tab. Thus, the bent portions 56 of the tabs snap onto the thermal plate firmly attaching the heat sink/retention mechanism thereto. Thus, the simple movement of the crossbars down causes the tabs 30 to move down so that tabs 30 may catch beneath the thermal plate of the processor assembly. Moreover, with the tabs forced down by the bent portions 56 being extended below the thermal plate, the tension on the spring 20 provides significant pressure against the troughs of the folded fin against the base plate 18. Although this discussion in terms of direction talks about pushing the crossbars in the downward direction, it is recognized that the direction is actually irrelevant and depends only on the position of the thermal plate with respect to the heat sink/retention mechanism. Crossbars are pushed toward the base plate and the adjacent thermal plate. The dimensions of the spring clamp 20 and base plate portion 18 are that with the tabs attached to a Pentium II thermal plate in, accordance with a presently preferred embodiment, the force may be about 30 lbs. of pressure between the base plate 18 and thermal plate. The thermal contact between the base plate 18 and thermal plate can be further enhanced by applying a layer of thermally conductive grease to the underside of the base plate 18. In the presently preferred embodiment, a non-silicone based grease is used. If desired, a fan may be used in conjunction with the heat sink to increase the air flow through the air passageways of the heat sink.

The mounting extensions 71 of the presently described embodiment are each provided with two mounting bases 70 separated from one another so as to accommodate a slot connector 85 on a circuit board between the two mounting bases at each mounting extension. Thus, the mounting extensions of the heat sink/retention mechanism of the described embodiment straddle a slot connector 85 on a printed circuit board. The slot connector 85 is a conventional connector into which the electrical connector of the processor assembly is inserted for making electrical connection with the printed circuit board.

Referring now with respect to FIGS. 4 and 5, a method of mounting a processor assembly on a printed circuit board shall be described. A heat sink/retention mechanism such as heat sink/retention mechanism 110 is provided. A layer of thermally conductive grease may be applied to the underside of the base plate portion 18 of the base plate/retention mechanism 100. The thermal plate of a processor assembly 80 is brought into contact with the flat base plate portion 18. The heat sink is mechanically attached to the processor assembly. In the case of the embodiment shown in FIGS. 4 and 5, the crossbars 46 are pushed towards the thermal plate so that the tabs 30 engage the inner edge of the oval slots for the thermal plate. The spring clamp maintains the attachment between the processor assembly and the heat sink while continuing to exert pressure between the base plate and the thermal plate. The heat sink/retention mechanism 110 with the attached processor assembly 80 is then mounted on the circuit board 90. The connector of the processor is inserted into the elongated slot of the slot connector 85. The mounting bases 70 are placed on the circuit board straddling the slot connector 85. The fastening plugs or screws or other fasteners are inserted through the holes 74 in the mounting base to securely fasten the heat sink/retention mechanism to the circuit board. Alternative mounting methods may be used, including at least soldering and clamping. In the mounted position, the thermal plate of the processor assembly is perpendicular to the surface of the circuit board. The grounding plane on a printed circuit board is the conductive area with an electrical connection that will be connected to ground. Conductive areas of the grounding plane may advantageously be extended to the area on top of which the mounting bases will be secured. The base plate 18 and mounting extensions 71 provide an electrically conductive path. By fastening at least one of the mounting bases onto the printed circuit board in electrical contact with the grounding plane, the base plate and mounting extension become electrically grounded. The heat sink/retention mechanism 110 is preferably metal so that the mounting extension and base plate form an electrically conductive path. Since the thermal plate is in contact with the base plate 18, the thermal plate becomes grounded as well forming an EMI (electromagnetic interference) shield for the processor within the processor assembly. In this way, a grounding connection has been formed between the mounting extension 71 and the grounding plane of the printed circuit board.

Figure 6:
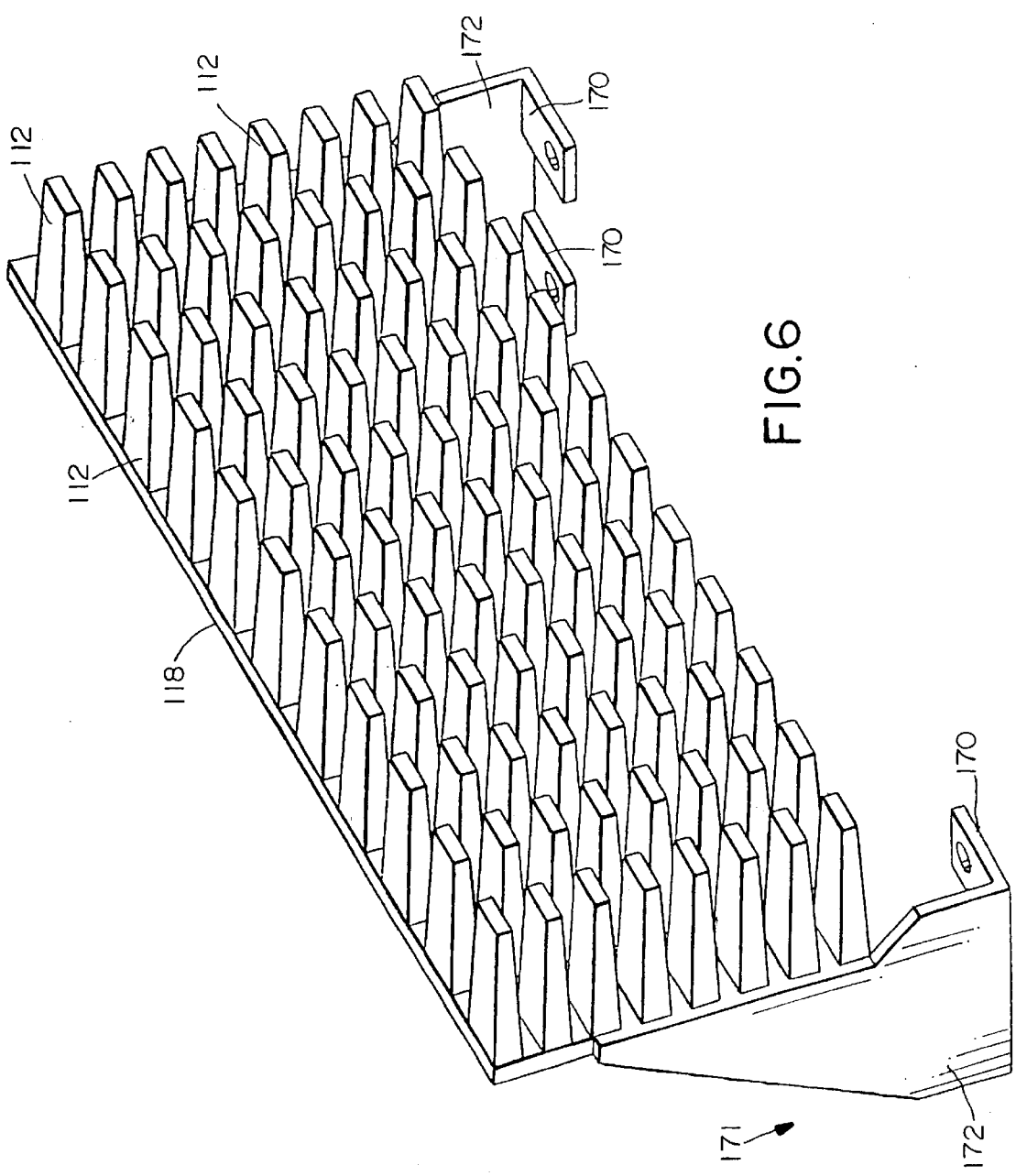
FIG. 6 is an isometric view of an integrated heat sink/retention mechanism of an embodiment of the invention.

Referring now to FIG. 6, it is noted that a heat sink for use in the heat sink/retention mechanism may be of any design providing a series of heat conductive surfaces that form a plurality of air passageways. FIG. 6 is an extruded aluminum heat sink. The extruded aluminum heat mechanism includes a base plate portion 118. A series of heat conductive surfaces 112 extend out from a side of the base plate 118 opposite from a flat surface of the base plate. The series of heat conductive surfaces 112 are arranged to provide air passageways therebetween so that air may flow by the heat sink so as to remove heat therefrom. A mounting extension 171 integral with the base plate 118 extends from the base plate to provide a retention mechanism. In the embodiment of FIG. 6, two mounting extensions 171 on opposite ends of the base plate 118 are each provided with a leg 172 and mounting bases 170 attached as feet to the legs 172. Any of a variety of mounting methods, including those already mentioned above, may be used to mount the heat sink/retention mechanism to the circuit board.

In order for the extruded heat sink/retention mechanism to be attached to a processor assembly, one or more holes may be provided in base plate 118. Screws or other fastening devices may be inserted through the holes to attach the base plate 118 to the thermal plate of the processor assembly. An alternative means of attachment would be to apply an adhesive layer onto the base plate 118 so as to adhesively attach base plate 118 to the thermal plate. Alternatively, attachment can be accomplished using a mechanical clamping mechanism.

Figure 7:
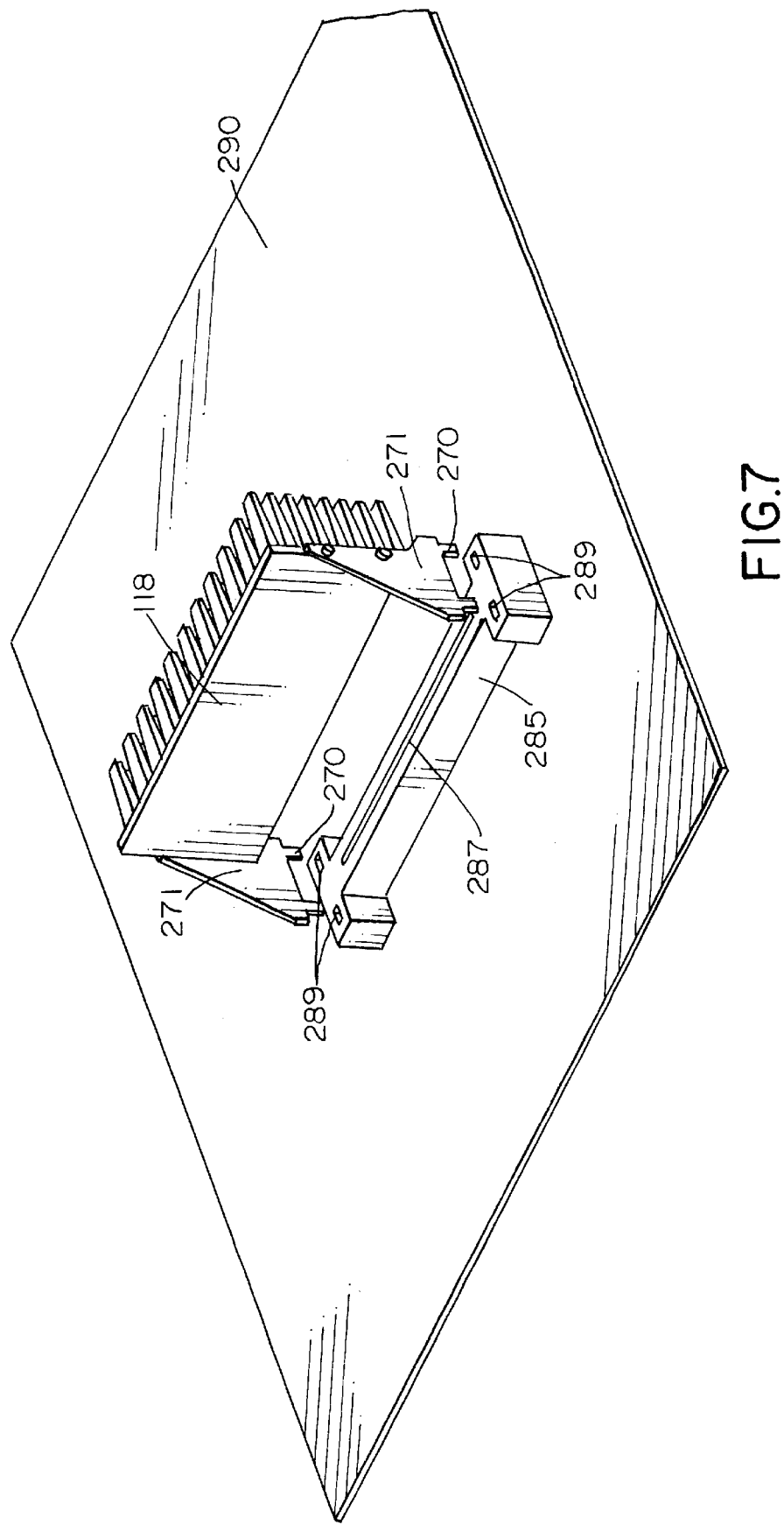
FIG. 7 is an isometric view of a motherboard and a heat sink retention mechanism of a further embodiment of the invention.

Referring now to FIG. 7, it is shown that alternate methods of mounting mechanisms may be employed in a heat sink/retention mechanism of embodiments of the present invention. In the embodiment of FIG. 7, the mount of the heat sink/retention mechanism is formed by mounting extensions 271 which have been securely fastened to the base plate 118 of an extruded aluminum heat sink. Thus, it is not necessary that the mounting extension be integral with the base plate 118. The mounting extensions 271 of FIG. 7 are further provided with feet in the form of tabs 270 for insertion into retention slots 289 in the slot connector 285. A slot connector 285 may be designed with an elongated slot 287 for receiving the electrical connector of the processor in a conventional manner. Retention slots 289 may be included on the slot connector 285 for performing the retention function. Moreover, the retention slots of the slot connector may be electrically connected to the ground plane of the circuit board 290. In this manner, insertion of the mounting extensions of the heat sink/retention mechanism into the retention slots form a grounding connection, thereby grounding the heat sink and the thermal plate in contact therewith. The grounded thermal plate serves to act as an EMI shield for the processor assembly.

Of course, it should be understood that various changes and modifications to the preferred embodiments described will be apparent to those skilled in the art. For example, numerous alternatives for the arrangement of thermally conductive surfaces on a heat sink are known to those of ordinary skill in the art. These and other changes can be made without departing from the spirit and scope of the invention and without diminishing, its attendant advantages. It is therefore intended that such changes and modifications be covered by the following claims.

I claim:

1. An integrated heat sink and retention mechanism comprising:
    a heat sink having a series of heat conductive surfaces forming a plurality of air passageways, said heat conductive surfaces include a corrugated thermally conductive sheet forming the series of ridges and troughs, and said heat sink includes a base plate integral with said mounting extension and a clamp forcing the troughs of the corrugated thermally conductive sheet against the base plate;
    a mounting extension integral with said heat sink, said mounting extension and said heat sink providing an electrically conductive path; and
    an attachment device operable to attach a heat generating processor assembly to said heat sink so as to establish thermal contact between said heat sink and the heat generating processor assembly and an electrically conductive path from the heat generating processor assembly to said mounting extension.

2. The integrated heat sink and retention mechanism of claim 1 wherein said mounting extension attaches to a circuit board so as to orient the base plate perpendicular to the circuit board.

3. The integrated heat sink and retention mechanism of claim 1 wherein said mounting extension comprises feet connected to a plurality of legs.

4. The integrated heat sink and retention mechanism of claim 1 wherein said attachment device comprises at least one tab extending from said clamp.

5. The integrated heat sink and retention mechanism of claim 1 wherein said attachment device comprises at least one screw.

6. The integrated heat sink and retention mechanism of claim 1 wherein said clamp is a spring clamp.

7. The integrated heat sink and retention mechanism of claim 3 wherein said feet are insertable into retention slots attached to a circuit board.

8. The integrated heat sink and retention mechanism of claim 3 wherein said feet are attachable to a circuit board.

9. A motherboard comprising:
    a circuit board;
    a slot connector mounted on said circuit board, said slot connector having an elongated slot;
    a heat sink;
    a processor board inserted in the elongated slot of said slot connector with said processor board oriented perpendicular to said circuit board; and
    a thermal plate in thermal contact with a processor on said processor board and attached to said heat sink to establish thermal contact between said heat sink and said thermal plate, said thermal plate having at least one mounting leg extending therefrom for securely mounting said heat sink on a circuit board.

10. The motherboard of claim 9 wherein said retention slots are in contact with a grounding plane on said circuit board and said heat sink provides an electrically grounded path to said thermal plate.

11. The motherboard of claim 9 further comprising a clamp pressing said heat sink against said thermal plate.

12. The motherboard of claim 9 wherein said slot connector includes a plurality of retention slots and wherein said at least one mounting leg comprises feet inserted in said retention slots.

13. An integrated heat sink and retention mechanism comprising:
    a heat sink, said heat sink includes a thermally conductive sheet folded into a series of alternating ridges and troughs, a base plate and a clamp forcing the troughs of the corrugated thermally conductive sheet against the base plate;
    means for attaching said heat sink to a processor assembly; and
    at least one mounting leg connected to said heat sink for securely mounting said heat sink on a circuit board.

14. The integrated heat sink and retention mechanism of claim 13 wherein said means for attaching said heat sink to said processor assembly includes a tab extending from said clamp.

15. The integrated heat sink and retention mechanism of claim 13 wherein said mounting leg is transverse said base plate.

16. The integrated heat sink and retention mechanism of claim 13 wherein said means for attaching said thermally conductive sheet to the base plate also attaches said heat sink to said processor assembly.

17. The integrated heat sink and retention mechanism of claim 13 wherein said at least one mounting leg extends from the base plate.

18. The integrated heat sink and retention mechanism of claim 13 wherein said at least one mounting leg includes at least one mounting base, said at least one mounting base being fastenable to the circuit board.

19. The integrated heat sink and retention mechanism of claim 17 wherein said mounting leg includes feet connected to said plurality of legs, said feet being insertable into retention slots attached to the circuit board.

20. The integrated heat sink and retention mechanism of claim 13 wherein said means for attaching includes at least one screw.

21. The integrated heat sink and retention mechanism of claim 13 wherein said at least one mounting leg and said heat sink provide an electrically conductive path from the circuit board to the processor assembly.

22. The integrated heat sink and retention mechanism of claim 13 wherein said clamp is a spring clamp.

23. The integrated heat sink and retention mechanism of claim 13 wherein said at least one mounting leg is integral with the heat sink.

24. An integrated heat sink and retention mechanism comprising:
   a heat sink having a series of heat conductive surfaces forming a plurality of air passageways, said heat conductive surfaces include a thermally conductive sheet forming a series of ridges and troughs, and said heat sink includes a base plate and a clamp forcing said troughs of said thermally conductive sheet against said base plate;
   a mounting extension extending from said heat sink, said mounting extension and said heat sink providing an electrically conductive path; and
   an attachment device operable to attach a heat generating processor assembly to said heat sink so as to establish thermal contact between said heat sink and the heat generating processor assembly and an electrically conductive path from the heat generating processor assembly to said mounting extension.

25. The integrated heat sink and retention mechanism of claim 24 wherein said mounting extension comprises feet connected to a plurality of legs.

26. The integrated heat sink and retention mechanism of claim 24 wherein said mounting extension attaches to a circuit board so as to orient said base plate generally perpendicular to said circuit board.

27. The integrated heat sink and retention mechanism of claim 24 wherein said attachment device comprises at least one tab extending from said clamp.

28. The integrated heat sink and retention mechanism of claim 24 wherein said clamp is a spring clamp.

29. The integrated heat sink and retention mechanism of claim 25 wherein said feet are insertable into retention slots attached to a circuit board.

30. The integrated heat sink and retention mechanism of claim 25 wherein said feet are attachable to a circuit board.

31. The integrated heat sink and retention mechanism of claim 25 wherein said attachment device comprises at least one screw.

\* \* \* \* \*